US011942473B2

(12) United States Patent
Luo et al.

(10) Patent No.: US 11,942,473 B2
(45) Date of Patent: Mar. 26, 2024

(54) ELECTROSTATIC DISCHARGE PROTECTION FOR HIGH SPEED TRANSCEIVER INTERFACE

(71) Applicant: Analog Devices, Inc., Wilmington, MA (US)

(72) Inventors: Sirui Luo, Carlisle, MA (US); Srivatsan Parthasarathy, Acton, MA (US); Piotr Olejarz, Belmont, MA (US); Daniel Boyko, Norwood, MA (US); Ara Arakelian, Waltham, MA (US); Stuart Patterson, East Walpole, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/806,903

(22) Filed: Jun. 14, 2022

(65) Prior Publication Data

US 2023/0402448 A1    Dec. 14, 2023

(51) Int. Cl.
*H01L 27/02* (2006.01)
*H02H 9/04* (2006.01)

(52) U.S. Cl.
CPC ......... *H01L 27/0262* (2013.01); *H02H 9/046* (2013.01)

(58) Field of Classification Search
CPC ............................ H01L 27/0262; H02H 9/046
(Continued)

(56) References Cited

U.S. PATENT DOCUMENTS 5,541,801 A * 7/1996 Lee .................... H01L 27/0262
                                                      361/111
5,576,557 A    11/1996 Ker et al.
(Continued)

FOREIGN PATENT DOCUMENTS

CN    111799258 A      10/2020
EP      3477700 A1 *   5/2019 ............... G07C 5/00
(Continued)

OTHER PUBLICATIONS

Austin W., "ESD and Transient Protection Using the SP720", Littelfuse®, Jan. 1998, Document ID: AN9304.4; 10 pages.
(Continued)

*Primary Examiner* — Dharti H Patel
(74) *Attorney, Agent, or Firm* — Knobbe, Martens, Olson & Bear, LLP

(57) ABSTRACT

Electrostatic discharge protection for high speed transceiver interface is disclosed. In one aspect, an electrical overstress (EOS) protection device includes an anode terminal and a cathode terminal, a silicon controlled rectifier, a second NPN bipolar transistor including a base connected to the anode terminal and an emitter connected to an emitter of the first PNP bipolar transistor, and a second PNP bipolar transistor including an emitter connected to an emitter of the second NPN bipolar transistor and a base connected to a base of the first PNP bipolar transistor. Two or more paths for current conduction are present during a positive overstress transient that increases a voltage of the anode terminal relative to the cathode terminal, including a first path through the silicon controlled rectifier and a second path through the second NPN bipolar transistor and the second PNP bipolar transistor.

20 Claims, 7 Drawing Sheets

(58) Field of Classification Search
USPC .......................................................... 361/56
See application file for complete search history.

(56) References Cited

U.S. PATENT DOCUMENTS

| | | | |
|---|---|---|---|
| 6,724,050 B2 | 4/2004 | Salling et al. | |
| 7,087,938 B2 | 8/2006 | Streibl et al. | |
| 7,102,864 B2 | 9/2006 | Liu et al. | |
| 7,274,047 B2 | 9/2007 | Russ et al. | |
| 8,134,211 B2 | 3/2012 | Manna et al. | |
| 8,592,860 B2 | 11/2013 | Salcedo et al. | |
| 8,665,571 B2 | 3/2014 | Salcedo et al. | |
| 9,006,782 B2 | 4/2015 | Salcedo | |
| 9,029,206 B2 | 5/2015 | Gauthier, Jr. et al. | |
| 9,356,011 B2 | 5/2016 | Clarke et al. | |
| 9,478,608 B2 | 10/2016 | Salcedo et al. | |
| 9,722,419 B2* | 8/2017 | Besse ..................... | H02H 9/046 |
| 9,899,368 B2 | 2/2018 | Edwards et al. | |
| 9,954,356 B2 | 4/2018 | Parthasarathy et al. | |
| 10,249,609 B2 | 4/2019 | Salcedo et al. | |
| 10,424,579 B2 | 9/2019 | Scholz et al. | |
| 2007/0002508 A1* | 1/2007 | Vanysacker ......... | H01L 27/0262 |
| | | | 361/56 |
| 2013/0114170 A1* | 5/2013 | Chen ...................... | H02H 9/046 |
| | | | 361/56 |
| 2013/0128399 A1* | 5/2013 | Davis .................. | H01L 27/0262 |
| | | | 361/56 |
| 2014/0027815 A1* | 1/2014 | Su ....................... | H01L 29/7436 |
| | | | 257/E21.608 |
| 2014/0167105 A1* | 6/2014 | Salcedo .............. | H01L 27/0262 |
| | | | 257/140 |
| 2014/0268451 A1* | 9/2014 | Van Wijmeersch ... | H02H 9/046 |
| | | | 361/56 |
| 2016/0056146 A1* | 2/2016 | Li ........................ | H01L 29/7416 |
| | | | 257/133 |
| 2017/0077082 A1 | 3/2017 | Marreiro et al. | |
| 2018/0226788 A1* | 8/2018 | Salcedo ................ | H02H 7/205 |
| 2019/0131787 A1* | 5/2019 | He ....................... | H01L 29/7408 |
| 2019/0198493 A1 | 6/2019 | Lai et al. | |
| 2020/0135714 A1 | 4/2020 | Mallikarjunaswamy | |
| 2021/0183851 A1* | 6/2021 | Davis ................. | H01L 27/0262 |
| 2023/0050292 A1* | 2/2023 | Mallikarjunaswamy .................... | |
| | | | H01L 23/535 |

FOREIGN PATENT DOCUMENTS

| | | | | | |
|---|---|---|---|---|---|
| JP | | 2019041101 A | * | 3/2019 | ......... H01L 27/0255 |
| WO | WO-2008102285 A1 | * | 8/2008 | ......... H01L 27/0262 |

OTHER PUBLICATIONS

Extended European Search Report received in 23178549.4, dated Nov. 7, 2023.

* cited by examiner

US 11,942,473 B2

ELECTROSTATIC DISCHARGE PROTECTION FOR HIGH SPEED TRANSCEIVER INTERFACE

FIELD OF THE DISCLOSURE

Embodiments of the invention relate to electronic systems, and more particularly, to electrostatic discharge protection for electronic interfaces.

DESCRIPTION OF THE RELATED TECHNOLOGY

Certain electronic systems can be exposed to an electrical overstress event, or a transient electrical signal of a relatively short duration having rapidly changing voltage and high power. Electrical overstress events can include, for example, electrostatic discharge (ESD) events and/or electromagnetic interference (EMI) events.

Electrical overstress events can damage integrated circuits (ICs) inside an electronic system due to overvoltage conditions and/or high levels of power dissipation over relatively small areas of the ICs. High power dissipation can increase IC temperature, and can lead to numerous irreversible problems, such as gate oxide breakdown, junction damage, metal damage, and surface charge trapping. Moreover, electrical overstress events can induce latch-up (in other words, inadvertent creation of a regenerative low-impedance path), thereby disrupting the functioning of the IC and/or potentially causing permanent damage to the IC.

As ICs are manufactured with increasingly higher datarates, there is a need for high speed protection devices that can handle the increased data rates. In addition, it is desirable to provide a protection device that reduces the number of off-shelf components by providing as much functionality on-chip as possible.

SUMMARY OF THE DISCLOSURE

In one aspect, an electrical overstress (EOS) protection device is provided. The EOS protection device includes an anode terminal, a cathode terminal, and a first silicon controlled rectifier (SCR) including a first PNP bipolar transistor and a first NPN bipolar transistor that are cross-coupled with a base of the first PNP bipolar transistor connected to a collector of the first NPN bipolar transistor and with a base of the first NPN bipolar transistor is connected to a collector of the first PNP bipolar transistor, wherein an emitter of the first NPN bipolar transistor is connected to the cathode terminal. The EOS protection device further includes a second NPN bipolar transistor including a base connected to the anode terminal and an emitter connected to an emitter of the first PNP bipolar transistor, and a second PNP bipolar transistor including an emitter connected to an emitter of the second NPN bipolar transistor and a base connected to the base of the first PNP bipolar transistor. Two or more paths for current conduction are present during a positive overstress transient that increases a voltage of the anode terminal relative to the cathode terminal, including a first path through the first SCR and a second path through the second NPN bipolar transistor and the second PNP bipolar transistor.

In another aspect, an electrical overstress (EOS) protection device is provided. The EOS protection device includes a p-type substrate and a plurality of wells including a first p-type well (PW), a second PW, an n-type well (NW), a first deep n-type well (DNW) electrically isolating the first PW from the p-type substrate, and a second DNW electrically isolating the second PW from the p-type substrate. The EOS protection device further includes a plurality of active regions including a first n-type active (N+) region formed in the first PW and connected to a cathode terminal, a second N+ region formed in the second PW, a first p-type active (P+) region formed in the NW and connected to the second N+ region in metallization, and a second P+ region formed in the second PW and connected to an anode terminal. The first P+ region, the NW, and first PW form a first PNP bipolar transistor, and the first N+ region, the first PW, and the NW form a first NPN bipolar transistor that is cross-coupled with the first PNP bipolar transistor to form a first silicon controlled rectifier (SCR). The second N+ region, the second PW, and the second DNW form a second NPN bipolar transistor. The first P+ region, the NW, and the p-type substrate form a second PNP bipolar transistor. Two or more paths for current conduction are present during a positive overstress transient that increases a voltage of the anode terminal relative to the cathode terminal, including a first path through the first SCR and a second path through the second NPN bipolar transistor and the second PNP bipolar transistor.

In another aspect, a protection device is provided. The protection device includes an anode terminal, a cathode terminal, a first silicon controlled rectifier, an NPN bipolar transistor and a PNP bipolar transistor. The NPN bipolar transistor and the PNP bipolar transistor are configured to provide a second silicon controlled rectifier in parallel to the silicon controlled rectifier. Two or more paths for current conduction are present during a positive overstress transient that increases a voltage of the anode terminal relative to the cathode terminal, including a first path through the silicon controlled rectifier and a second path through the PNP bipolar transistor.

DETAILED DESCRIPTION OF EMBODIMENTS

Figure 1:
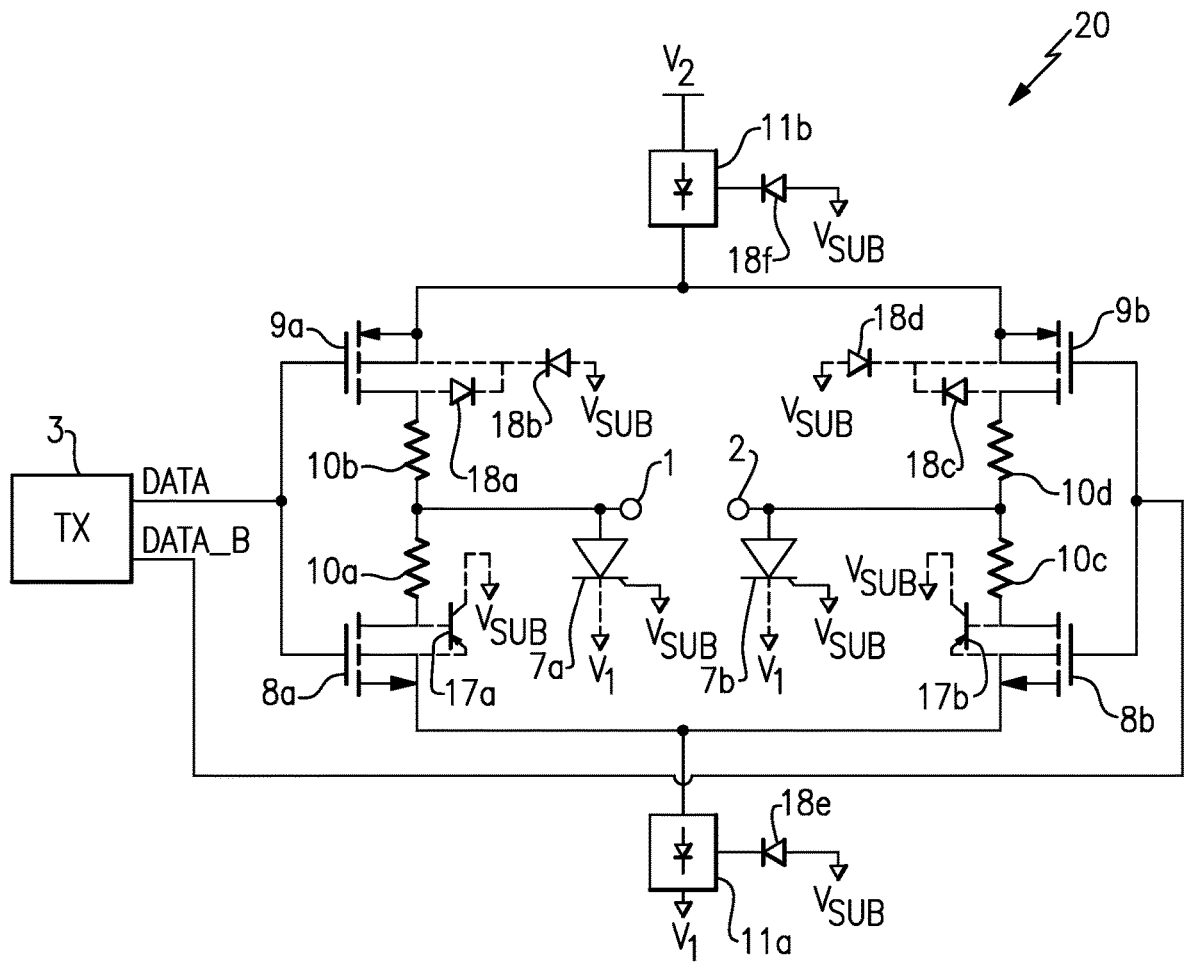
FIG. 1 shows a circuit diagram of one example of a transceiver interface.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of electrical overstress events as discussed above, including electrostatic discharge (ESD) events and/or electromagnetic interference (EMI) events.

Monolithic bi-directional protection devices are provided herein. In certain embodiments, a protection device includes a forward-biased diode and a silicon-controlled rectifier (SCR) that are implemented in a common semiconductor tub to provide protection to one or more pins or pads of an IC interface. For example, the protection device can be used to protect transceiver interface inputs and/or outputs, signal amplifier inputs and/or outputs, and/or data converters inputs and/or outputs.

The protection device operates with a small amount of total parasitic capacitance that behaves linearly over the operating voltage range of the IC interface. For example, the forward-biased diode (which can correspond to a base-emitter junction of a bipolar transistor) provides a diffusion capacitance while the SCR provides a depletion capacitance. Although each of these individual capacitances behave non-linearly, collectively the diffusion capacitance of the forward-biased diode and the depletion capacitance of the SCR behave linearly.

Accordingly, the protection device is well suited for protecting signal pins of an IC interface for high speed applications sensitive to capacitive loading. For example, the protection device can be used in a variety of applications, including local interconnect network (LIN) interfaces, controller area network (CAN) interfaces, FlexRay interfaces, RS-232 interfaces, RS-485 interfaces, single edge nibble transmission (SENT) interfaces, and/or Automotive Audio Bus (ATB) interfaces, such as A²B devices.

In certain implementations, the protection device includes one or more features to achieve low capacitance, for instance, using a diode in series with SCR (which can correspond to a base-to-emitter junction of a bipolar transistor, in some implementations) and/or using a floating n-type well (NW) for the SCR to reduce depletion capacitance between anode and cathode. The SCR itself also incorporated fast turn on features implemented using poly gates to isolate n-type and p-type diffusion regions rather than shallow trench isolation (STI) regions.

The protection device operates bi-directionally, thereby providing protection against both positive polarity and negative polarity overstress. In certain implementations, deep n-type well (DNW) forming the semiconductor tub includes DNW isolated diodes used to provide reverse (negative polarity) protection. Furthermore, the DNW isolate diodes can provide additional parallel SCR action that aids in not only making overstress protection more robust, but also in addressing fault conditions arising when the transceiver interface is powered up (for instance, using a 3.3 V or 5 V power supply).

Certain protection schemes for transceiver interfaces include a combination of off-chip and on-chip components, which increase component count and capacitance. In contrast, the protection devices herein can be implemented on a single semiconductor IC or chip while still providing robust performance, such as protection against 8000V system level overstress. Accordingly, the benefits of both compact integration and robust performance can be achieved.

FIG. 1 shows a circuit diagram of one example of a transceiver interface 20, which can include one or more monolithic bi-directional protection devices described herein. The transceiver interface 20 includes a first pin 1, a second pin 2, a transmitter circuit 3, a first monolithic bi-directional protection device 7a, a second monolithic bi-directional protection device 7b, a first n-type metal oxide semiconductor (NMOS) transistor 8a, a second NMOS transistor 8b, a p-type metal oxide semiconductor (PMOS) transistor 9a, a second PMOS transistor 9b, a first resistor 10a, a second resistor 10b, a third resistor 10c, a fourth resistor 10d, a first diode structure 11a, and a second diode structure 11b.

As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The transceiver interface 20 can be, for example, an interface IC in which the first and second pins 1, 2 are directly exposed to a user, for instance, connected to car cables or an industrial machinery hardness, in a normal operational environment. The transceiver interface 20 can be used to communicate data over the interface, such as by using low voltage differential signaling. For clarity of the figures, details related to receiving signals over the first and second pins 1, 2 have been omitted from FIG. 1.

The NMOS transistors 8a, 8b and PMOS transistors 9a, 9b can be used for electrically transmitting signals over the first and second pins 1, 2. For example, the transmitter circuit 3 can be used to control the gate voltages of the NMOS transistors 8a, 8b and PMOS transistors 9a, 9b to control a differential voltage between the first and second pins 1, 2. The voltage can have positive or negative polarity.

As shown in FIG. 1, the transceiver interface 20 can receive power from a power high supply voltage $V_2$ and a power low supply voltage $V_1$. Certain components of the transceiver interface 20, such as the NMOS transistors 8a, 8b, PMOS transistors 9a, 9b, diode structures 11a, 11b, and monolithic bi-directional protection devices 7a, 7b can be fabricated in a substrate that is biased using a substrate voltage $V_{SUB}$.

Various parasitic substrate devices can be present in the transceiver interface 20. The parasitic substrate devices can include terminals electrically connected to the substrate voltage $V_{SUB}$. Absent protection, the parasitic substrate devices may be damaged during ESD and/or EMI conditions.

In the illustrated configuration, the NMOS transistors 8a, 8b include parasitic substrate bipolar transistors 17a, 17b, respectively. Additionally, the PMOS transistors 9a, 9b include parasitic substrate diodes 18a-18d. Furthermore, the diode structures 11a, 11b include parasitic substrate diodes 18e, 18f, respectively. Although a certain parasitic substrate devices are shown in FIG. 1, other configurations of parasitic substrate devices are possible. In some embodiments, the diode structures 11a, 11b, and parasitic substrate diodes 18a-18d may not be included in the transceiver interface 20. For example, in certain implementations, the sources of the PMOS transistors 9a, 9b may be directed connected to the power high supply voltage $V_2$ and the sources of the NMOS transistors 8a, 8b may be directed connected to the power low supply voltage $V_1$. In some embodiments, the backgate of each of the PMOS transistors 9a, 9b the NMOS transistors 8a, 8b may be connected to their respective sources or driven by a floating well drive.

The first monolithic bi-directional protection device 7a includes an anode terminal (A) electrically connected to the first pin 1, a cathode terminal (C) electrically connected to the power low voltage $V_1$, and a substrate terminal (SUBST) electrically connected to the substrate voltage $V_{SUB}$. Additionally, the second monolithic bi-directional protection device 7b includes an anode terminal electrically connected to the second pin 2, a cathode terminal electrically connected to the power low voltage $V_1$, and a substrate terminal electrically connected to the substrate voltage $V_{SUB}$. The first and second monolithic bi-directional protection devices 7a, 7b can be used to protect the transceiver interface 20 from ESD and/or EMI events. The monolithic bi-directional protection devices 7a, 7b can protect components of the transceiver interface 20 including, for example, parasitic substrate devices associated with the components.

The transceiver interface 20 of FIG. 1 illustrates one example of a transceiver interface that can be implemented using the monolithic bi-directional protection devices described herein. However, the transceiver interfaces can be implemented in other ways to meet communication protocol constraints.

Additionally, although the monolithic bi-directional protection devices have been illustrated in the context of transceiver interfaces, the clamp devices described herein can be used in a wide range of ICs and other electronics, including, for example, industrial control systems, interface systems, power management systems, microelectromechanical system (MEMS) sensor systems, automotive systems, wireless infrastructure systems, and/or digital signal processing (DSP) systems.

Additionally, although the transceiver interface 20 has been illustrated as including two signal pins and two monolithic bi-directional protection devices, more or fewer monolithic bi-directional protection devices and pins can be included to meet system specifications. Furthermore, the monolithic bi-directional protection devices can be connected in other ways. For example, the terminals of the clamp devices can be connected in other ways, such as to other nodes and/or voltages.

Figure 2:
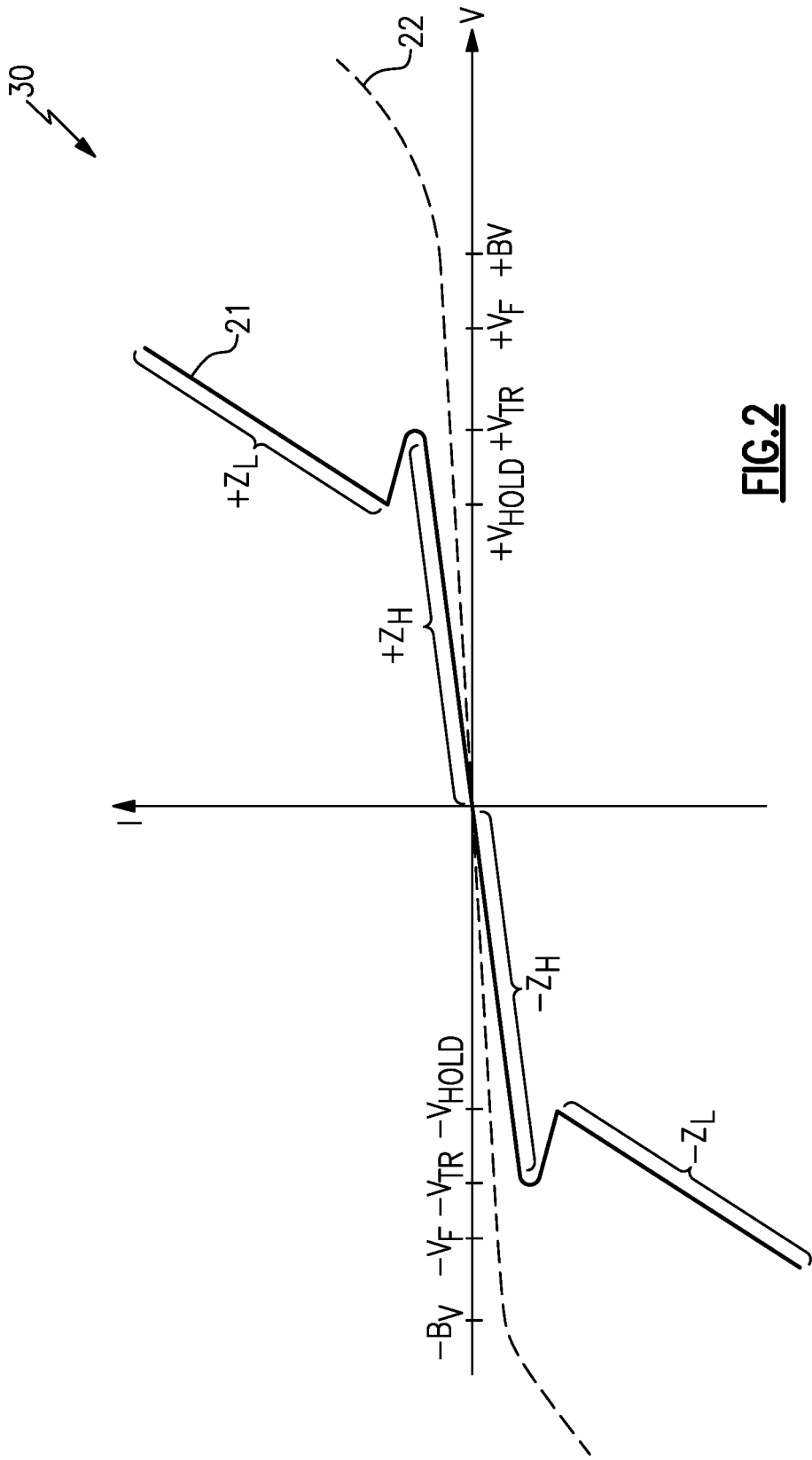
FIG. 2 is a graph showing a relationship between current and voltage of a dual-polarity overvoltage clamp device according to one embodiment.

FIG. 2 is a graph 30 showing a relationship between current and voltage of a clamp device according to one embodiment. As described above, a clamp device can include an anode terminal, a cathode terminal, and a substrate terminal.

The graph 30 includes a first plot 21 corresponding to one example of a clamp device current versus voltage (I-V) relationship when the voltage of the first terminal is varied while the voltages of the second terminal and the substrate terminal are independent and held constant. Additionally, the graph 30 includes a second plot 22 corresponding to one example of a monolithic bi-directional protection device response when the voltage of the substrate terminal is varied while the voltage of the first terminal and the second terminal are held constant.

As shown in FIG. 2, the monolithic bi-directional protection device can transition from a high-impedance state $+Z_H$ to a low-impedance state $+Z_L$ when the voltage difference between the first terminal and the second terminal reaches a positive trigger voltage $+V_{TR}$. Thereafter, the clamp device can shunt a large amount of current and remain in the low-impedance state $+Z_L$ as long as the voltage difference between the first terminal and the second terminal remains above a positive holding voltage $+V_{HOLD}$. By configuring the monolithic bi-directional protection device to have both a trigger voltage and a holding voltage, the monolithic bi-directional protection device can exhibit enhanced stability against unintended activation.

The monolithic bi-directional protection device can also transition from a high-impedance state $-Z_H$ to a low-impedance state $-Z_L$ when the voltage difference between the first terminal and the second terminal reaches a negative trigger voltage $-V_{TR}$. The monolithic bi-directional protection device can remain in the low-impedance state $-Z_L$ as long as the voltage difference between the first terminal and the second terminal remains below the negative holding voltage $-V_{HOLD}$. Bi-directional operation of the monolithic bi-directional protection device can permit a reduction in layout area relative to a design that uses separate structures (for example, a combination of on-chip and off-chip components) for protection against positive and negative electrical overstress events, thereby enabling a more scalable design solution.

As shown in FIG. 2, the monolithic bi-directional protection device can be configured to transition to a low-impedance state before the voltage difference between the first terminal and the second terminal reaches either a positive failure voltage $+V_F$ or a negative failure voltage $-V_F$ that can otherwise cause damage to the IC.

When normal operating voltages are applied to the terminals of the monolithic bi-directional protection device, the monolithic bi-directional protection device should conduct a relatively small leakage current, thereby reducing or minimizing static power dissipation and enhancing the energy efficiency of the IC. Thus, the monolithic bi-directional protection device can be configured to be very low leakage at normal operating voltages and to trigger during electrical overstress events before internal or core devices reach overvoltage conditions. The monolithic bi-directional protection device can also operate with a linear parasitic capacitance, as described herein.

As shown by the second plot 22, the monolithic bi-directional protection device can be highly isolated from voltage changes to the substrate terminal. For example, in the illustrated example, a positive substrate breakdown voltage +BV to the substrate terminal can be greater than the positive trigger voltage $+V_{TR}$, and a negative substrate breakdown voltage −BV to the substrate terminal can be beyond the negative trigger voltage $−V_{TR}$.

In certain implementations described herein, a clamp device is implemented to have a forward trigger voltage $+V_{TR}$ in the range of 3 V to 80 V, a forward holding voltage $+V_{HOLD}$ in the range of 2 V to 60 V, a reverse trigger voltage $−V_{TR}$ in the range of −3 V to −80 V, a reverse holding voltage $−V_{HOLD}$ in the range of −2 V to −60 V, a forward substrate breakdown voltage +BV in the range of 15 V to 100 V, and a revere substrate breakdown voltage −BV in the range of −3 V to −80 V. However, other implementations are possible.

In FIG. 2, voltage is expressed along a horizontal axis, and current is expressed along a vertical axis. In the illustrated embodiment, the clamp device has I-V characteristics that are symmetrical. In other implementations, the clamp devices described herein can have asymmetrical I-V characteristics. For example, clamp devices can have different trigger voltages, holding voltages, and/or failure voltages with different I-V curves in the positive and negative regions of the graph.

Electrostatic Discharge Protection Devices for High Speed Transceiver Interfaces Electrical overstress events such as electrostatic discharge (ESD) can damage or destroy integrated circuits (ICs) by generating overvoltage conditions and high levels of power dissipation in relatively small areas of the ICs. Silicon-controlled-rectifier (SCR) device topologies are often considered for ESD protection applications to achieve a higher level of robustness.

Aspects of this disclosure relate to ESD protection devices which can be used to protect ICs that meet new high data rates requirements. For example, A²B is a standard for a high data-rate communications, control, and power distribution bus. Successive generations of A²B devices are designed to support increased data rates, which previous ESD protection schemes may not be able to meet. The next generation of A²B devices provide higher data rates, which previous ESD protection device may not be able to meet.

In order to meet the data rate and robustness requirements to protect devices implementing certain standards such as A²B, a protection device may include one or more of the following characteristics: +/−8,000 V robustness or higher (e.g., +/−10,000 V), fault tolerance to about 1 A/5 V, about 3 pF linear capacitance or less, and manufactured using a deep submicron CMOS technology. In some implementations, deep submicron may refer to sub 90 nm or sub 65 nm process technologies. In the context of the next generation A²B family of interface products, there is a desired to solve the following technical problems: minimize the number of board-level components by providing for 8,000 V IEC protection on-chip and implement the on-chip 8,000 V protection element to with a low linear capacitance in order to meet the data-rate requirements for the next generation A²B products.

In particular, the capacitance of a protection device is related to the amount available bandwidth with lower capacitances increasing the bandwidth. Thus, it is desirable to reduce the capacitance of the protection device in order to meet data-rate (e.g. bandwidth) requirements. It can be difficult to simply use prior larger geometry designs (e.g., 180 nm) scaled for deep submicron processes. Specifically, the scaling of larger geometry designs leads to large capacitance in deep submicron designs. This scaling typically results in capacitance, which is outside of the bandwidth requirements for protection devices.

In some embodiments, ESD protection devices for A²B used a combination of off-chip and on-chip protection. However, it is desirable to provide solutions for 8,000 V IEC protection on-chip, reducing the need for off-self components. In addition, in order to meet requirements for increasing data-rates, there is a need for the on-chip 8,000 V protection element to have low linear capacitance.

In view of the above technical goals, aspects of this disclosure relate to protection device which includes a monolithic, bi-directional SCR that can address at least some of these problems. In particular, this disclosure relates to an improved monolithic bi-directional SCR that provides +/−8000 V protection using deep submicron design technology. SCRs of such requirement are traditionally manufactured using comparatively larger geometry technology.

Figure 3:
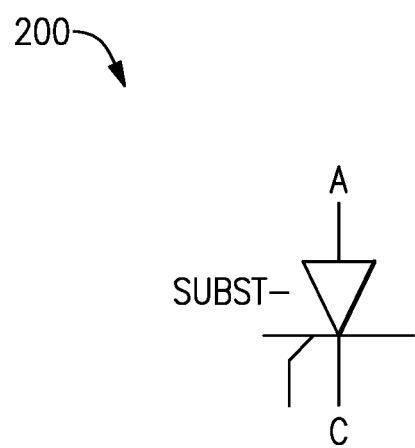
FIG. 3 provides an illustration of a symbol which represents a protection device in accordance with aspects of this disclosure.

FIG. 3 provides an illustration of a symbol which represents the protection device 200 in accordance with aspects of this disclosure. With reference to FIG. 3, the protection device 200 includes three pins, an anode A, a cathode C, and a substrate pin SUB ST.

Figure 4:
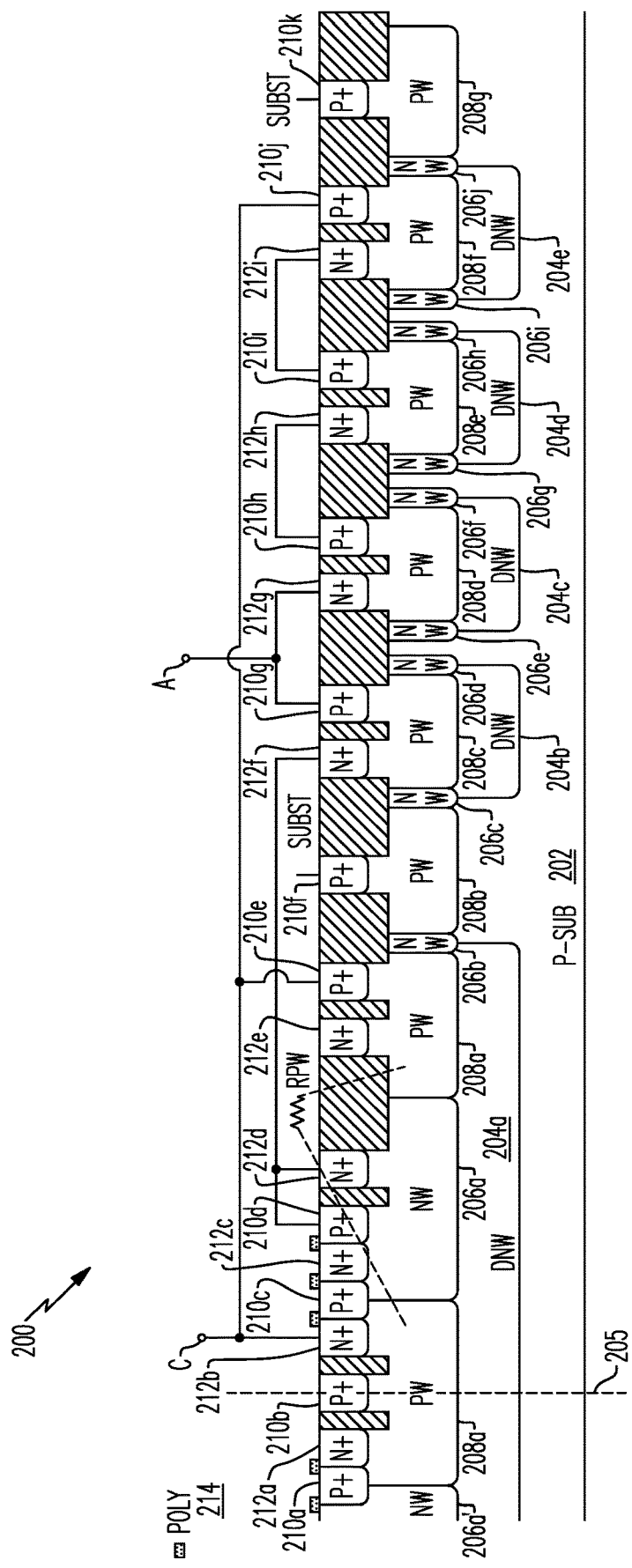
FIG. 4 is a cross-section of an embodiment of the protection device of FIG. 3 in accordance with aspects of this disclosure.

FIG. 4 is a cross-section of an embodiment of the protection device 200 of FIG. 3 in accordance with aspects of this disclosure.

With reference to FIG. 4, the protection device 200 is fabricated in a p-type substrate (P-SUB) 202, and includes a first deep n-type well (DNW) 204a, a second DNW 204b, a third DNW 204c, a fourth DNW 204d, and a fifth DNW 204e. The protection device 200 also includes one or more first n-type wells (n-well or NW) 206a and 206a', a second n-well 206b, a third n-well 206c, a fourth n-well 206d, a fifth n-well 206e, a sixth n-well 206f, a seventh n-well 206g, an eighth n-well 206h, a ninth n-well 206i, and a tenth n-well 206j. The protection device 200 further includes a first p-type well (p-well or PW) 208a, a second p-well 208b, a third p-well 208c, a fourth p-well 208d, a fifth p-well 208e, a sixth p-well 208f, and a seventh p-well 208g. Although FIG. 4 illustrates a cross-section of the protection device 200, the cross section may not be taken along a straight line. For example, in some implementations the regions formed in the DNW 204a may be formed in one area of the protection device layout 200 with the remainder of the regions formed in a separate area.

In the illustrated embodiment, the protection device 200 is implemented in an multi-finger configuration about an axis 205 for SCR section inside DNW 204a. In particular, a plurality of n-well fingers 206a, 206a' are formed in the DNW 204a with the p-well 208a surrounding each of the n-well fingers 206a and 206a'. Thus, when viewed from above, the first n-wells 206a and 206a' are implemented as fingers surrounded by the first p-well 208a. Additionally, the second p-well 208b is implemented as a ring surrounding the first n-well 206a. Likewise, the other wells of the protection device 200 are implemented in a multi-finger configuration of when viewed from above. However, other configurations, such as annular arrangements, are possible.

The protection device 200 also includes a first p-type active (P+) region 210a (also referred to a p-type diffusion region), a second P+ region 210b, a third P+ region 210c, a fourth P+ region 210d, a fifth P+ region 210e, a sixth P+ region 210f, a seventh P+ region 210g, an eighth P+ region 210h, a ninth P+ region 210i, a tenth P+ region 210j, and an eleventh P+ region 210k. The SCR further includes a first n-type active (N+) region 212a (also referred to as an n-type diffusion region), a second N+ region 212b, a third N+ region 212c, a fourth N+ region 212d, a fifth N+ region 212e, a sixth N+ region 212f, a seventh N+ region 212g, an eighth N+ region 212h, a ninth N+ region 212i, and a tenth N+ region 212j. The P+ and N+ regions can also be implemented as concentric rings in an annular configuration.

Various poly gates 214 are also depicted over the structure. As described earlier, using poly gates 214 to isolate adjacent N+ and P+ regions provides faster turn on speed relative to a configuration in which isolation is provided by STI regions.

As shown in FIG. 4, a resistance RPW associated with resistances between opposing portions of the first p-well 208a surrounding the first n-well 206a has been annotated.

The protection device 200 undergoes back end processing to form contacts and metallization. For clarity, electrical connections associated with back end processing are depicted schematically using circuit lines over the cross section.

As shown in FIG. 4, the anode A is connected to the seventh P+ region 210g (which is formed in p-well 208c) and the seventh N+ region 212g (which is formed p-well 208d). The cathode C is connected to the second N+ region 212b (which is formed in p-well 208a), the fifth P+ region 210e (which is formed in p-well 208a), and the tenth P+ region 210j (which is formed in p-well 208f). The substrate pin SUB ST is connected to the sixth P+ region 210f (which is formed in p-well 208b) and the eleventh P+ region 210k (which is formed in p-well 208g). In addition, the fourth P+ region 210d (which is formed in n-well 206a), the fourth N+ region 212d (which is formed in n-well 206a), and the sixth N+ region 212f (which is formed in p-well 208c) are electrically connected together using a first conductor (formed in back end metallization); the eighth P+ region 210h (formed in p-well 208d) and the eighth N+ region 212h (formed in p-well 208e) are electrically connected together using a second conductor (formed in back end metallization); and the ninth P+ region 210i (formed in p-well 208e) and the ninth N+ region 212i (formed in p-well 208f) are electrically connected together using a third conductor (formed in back end metallization).

Figure 5:
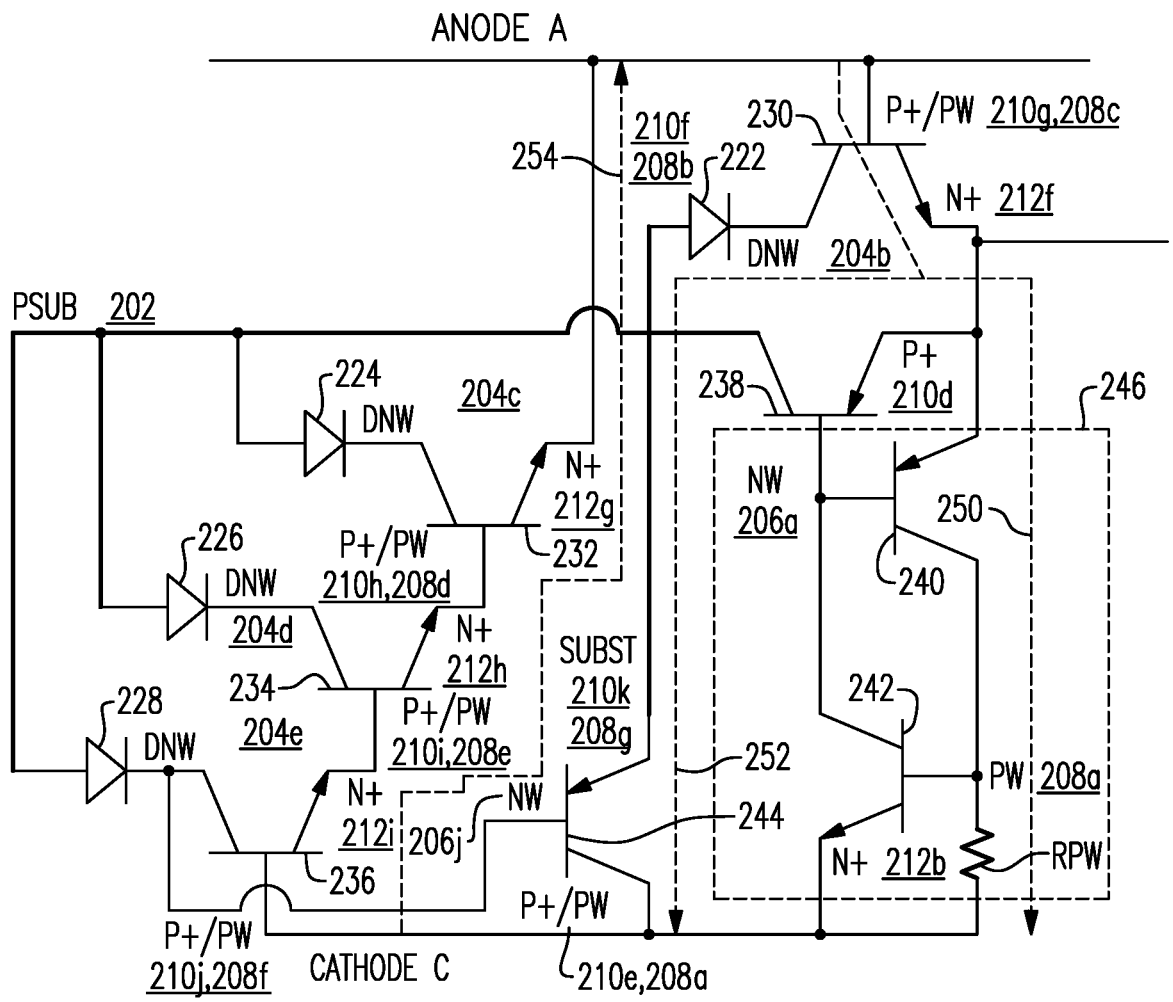
FIG. 5 shows a circuit diagram of the protection device of FIG. 4 in accordance with aspects of this disclosure.

FIG. 5 shows a circuit diagram of the protection device 200 of FIG. 4 in accordance with aspects of this disclosure. The circuit diagram represents a circuit representation of the circuit components present in the cross section of the protection device 200 of FIG. 4. Correspondence between the circuit diagram and various portions of the cross section are depicted in FIG. 5.

The circuit diagram of the protection device 200 includes an anode terminal A, a cathode terminal C, a substrate terminal SUBST, an auxiliary protection diode 222, a first reverse parasitic DNW diode 224, a second reverse parasitic DNW diode 226, and a third reverse parasitic DNW diode 228, a positive protection NPN bipolar transistor 230, a first reverse protection NPN bipolar transistor 232, a second reverse protection NPN bipolar transistor 234, a third reverse protection NPN bipolar transistor 236, a first positive protection PNP bipolar transistor 238, an SCR PNP bipolar transistor 240, an SCR NPN bipolar transistor 242, and a second positive parasitic protection PNP bipolar transistor 244. The SCR PNP bipolar transistor 240 and the SCR NPN bipolar transistor 242 include collectors and bases that are cross-coupled to form an SCR 246. As shown in FIG. 5, the resistor RPW is across the base-to emitter junction of the SCR NPN bipolar transistor 242.

The protection device 200 provides three different paths of current conduction during ESD transient events.

In response to a positive polarity ESD event, a first path 250 is formed from the anode A to the cathode C through the positive protection NPN bipolar transistor 230 (by way of the base-emitter junction) and the SCR 246. Also in response to the positive polarity ESD event, a second path 252 is formed from the anode A to the cathode C through the positive protection NPN bipolar transistor 230 (by way of the base-emitter junction), the first positive protection PNP bipolar transistor 238 (from emitter to collector), the P-SUB 202, and the second positive protection PNP bipolar transistor 244 (from emitter to collector).

In response to a negative polarity ESD event, a third path 254 is formed from the cathode C to the anode A through the third reverse protection NPN bipolar transistor 236 (through the base-emitter junction), the second reverse protection NPN bipolar transistor 234 (through the base-emitter junction), and the first reverse protection NPN bipolar transistor 232 (through the base-emitter junction).

The first and second paths 250 and 252 provide current conduction during positive ESD transients (e.g., when the voltage of the anode A is greater than the voltage of the cathode C), while the third path 254 provides current conduction during negative ESD transients (e.g., when the voltage of the anode A is less than the voltage of the cathode C). By providing the two separate paths 250 and 252 to handle positive ESD transients in the embodiment of the protection device 200, the protection device 200 is able to provide both comparatively high fault tolerance and comparatively high current handling. In addition, the first and second paths 250 and 252 are further able to ensure the initial SCR can be designed to have a high holding current and a high holding voltage. This enables the protection element to be substantially immune to any fault condition that may occur on the 5V transmitter interface power up either using a 3.3V or 5V supply.

The protection device 200 is designed using a combination of an SCR having P+ trigger variation with a diode network (e.g., including the diodes 224, 226, and 228) to achieve 8,000 V IEC compliance with decreased capacitance. The protection device 200 can protect I/O with up to 5 V+ blocking voltage and 3 V+ holding voltage requirements.

By constructing a protection device 200 in accordance with the embodiment illustrated in FIGS. 4 and 5, the resulting protection device 200 can provide any combination of the following characteristics: +/−8,000 V robustness, fault tolerance to about 1 A/5 V which is achieved by having a tunable holding voltage, 3 pF linear capacitance (which may represent the best in class for 8,000 V compliant device). The above characteristics of the protection device 200 can also be achieved using a 40 nm CMOS technology using standard process offerings that does not add any additional mask or cost to the product.

One advantageous feature of the protection device 200 is a linearization technique where the integrated layout combines a forward-biased diode (diffusion capacitance) and an SCR 246 (depletion capacitance) in a single tub such that the capacitance of the whole protection device 200 network is substantially linear over the operating voltage range.

Another advantageous feature is the use of the poly gates 214 (shown in FIG. 5B) to isolate the P+ and N+ regions 210 and 212 rather than shallow trench isolation, thereby increasing the speed of the SCR 246. The capacitance of the SCR 246 can also be reduced by floating the second n-well 206b. This eliminates a relatively large depletion capacitance present between the anode and the cathode of the SCR 246.

Yet another advantageous feature is the isolated diode stack 224/226/228 formed with the DNWs 204c-204e, which provide reverse negative direction protection. In addition, the diode 222, together with the transistors 230 and 244 (which have bases and collectors cross-coupled to form an SCR), provide additional SCR action in parallel to the SCR 246. For example, because the diode 222 is connected between the transistor 230 and the P-SUB 202, the second path 252 is provided between the anode A and the cathode C. In some embodiments, the additional SCR path 252 has a 7 V/1 A trigger, and once triggered the holding voltage collapses to 4 V and the power handling drastically reduces. This enables the protection device 200 to have a smaller lower capacitance while being able to handle 30 A of current.

The introduction of the additional SCR path 252 also allows the initial SCR 246 to be designed with a higher holding current (1 A)/voltage (6 V). In some embodiments, the additional SCR path 252 makes the protection device 200 virtually immune to any fault condition that can occur on a 5 V transceiver interface powered up either using a 3.3 V or a 5 V power supply.

Advantageously, since the protection device 200 provides a monolithic design, the protection device 200 is able to address the above problems without the use of external protection elements, which reduces the manufacturing costs for the system. The protection device 200 also has a lower capacitance and takes up a smaller area compared to alternative designs such as a monolithic bipolar protection device, which has a higher capacitance and larger footprint.

Figure 6A:
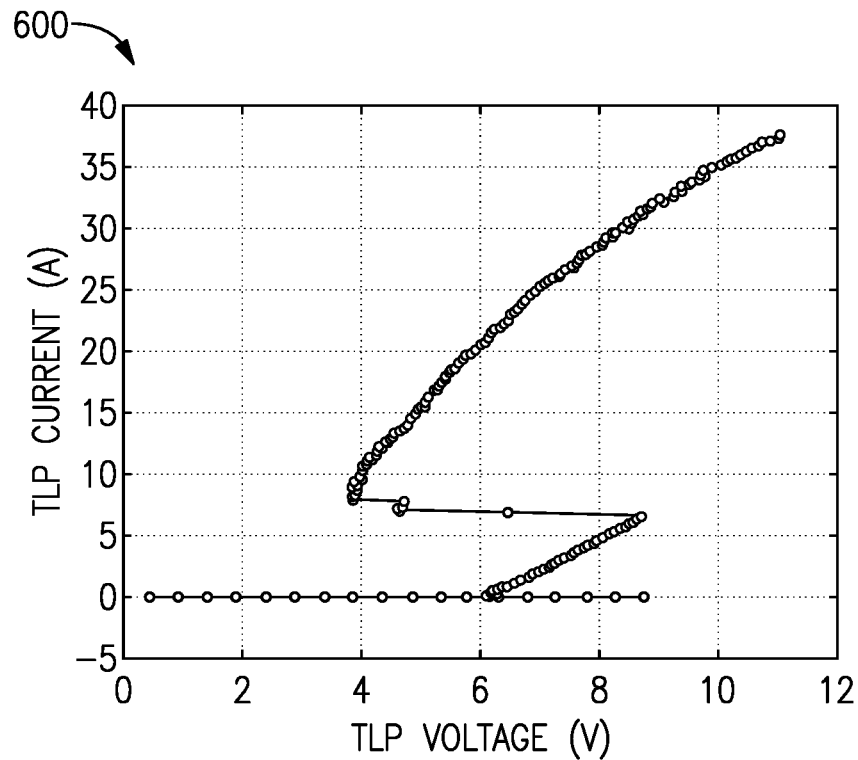
FIG. 6A is a graph showing a relationship between current and positive voltage of the protection device according to one embodiment.
Figure 6B:
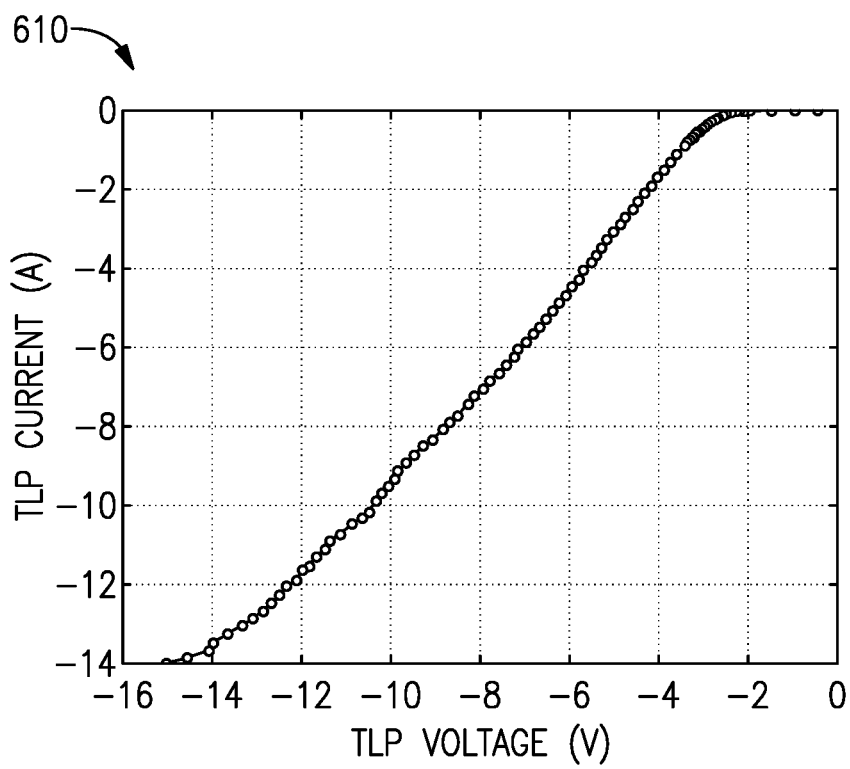
FIG. 6B is a graph showing a relationship between current and negative voltage of the protection device according to one embodiment.

FIG. 6A is a graph 600 showing a relationship between current and positive voltage of the protection device 200 according to one embodiment. FIG. 6B is a graph 610 showing a relationship between current and negative voltage of the protection device 200 according to one embodiment. The graphs 600 and 610 were generated using 100 ns transmission line pulse (TLP) testing with a 600 pS rise time.

Figure 7A:
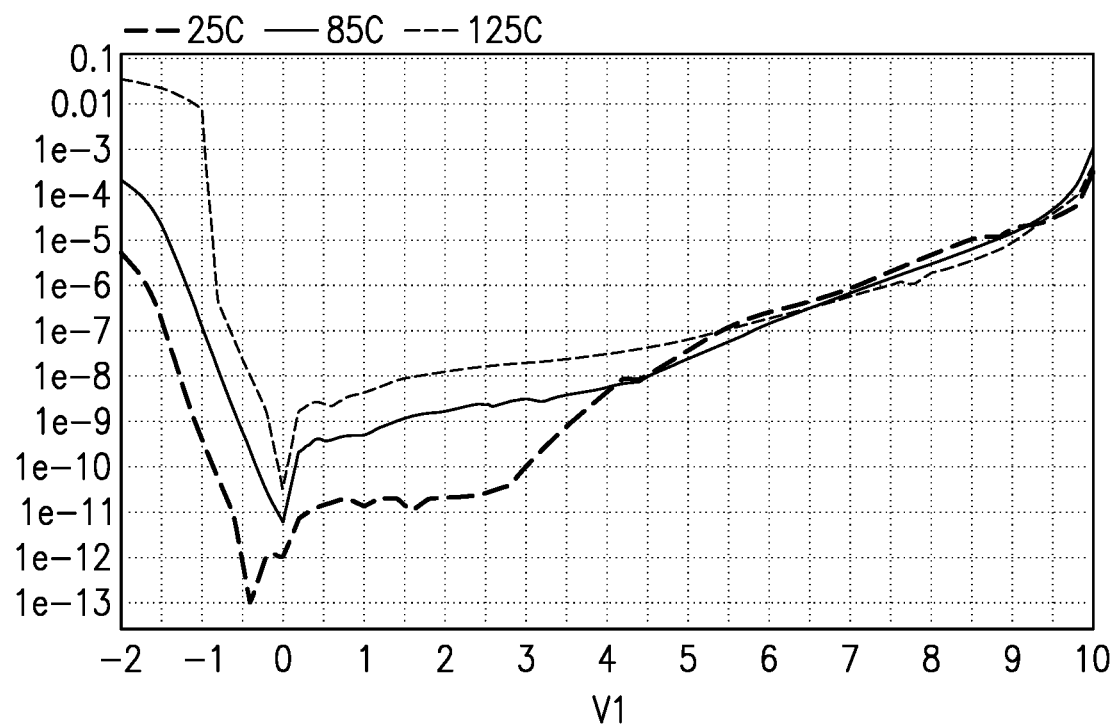
FIG. 7A is a graph showing the DC characterization (anode to cathode) of the protection device according to one embodiment.
Figure 7B:
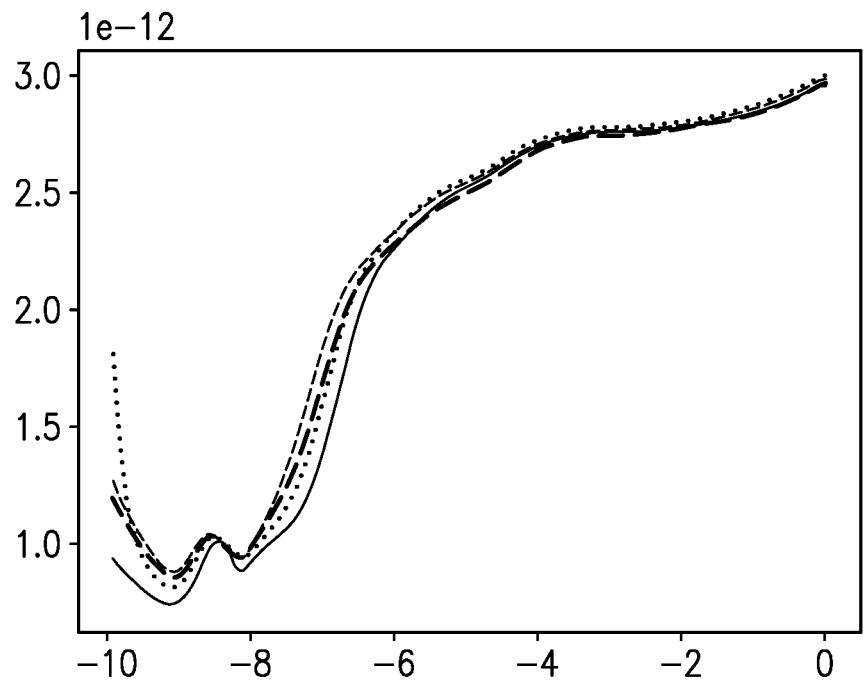
FIG. 7B is a graph showing the CV characterization (anode to cathode) of the protection device according to one embodiment.

FIG. 7A is a graph 700 showing the DC characterization (anode A to cathode C) of the protection device 200 according to one embodiment. The DC characterization is shown for each of a plurality of example temperatures (25° C., 85° C., and 125° C.). FIG. 7B is a graph 710 showing the CV characterization (anode A to cathode C) of the protection device 200 according to one embodiment.

Applications

Devices employing the above described schemes can be implemented into various electronic devices. Examples of electronic devices include, but are not limited to, RF communication systems, consumer electronic products, electronic test equipment, communication infrastructure, etc. For instance, RF switches with fast switching can be used in a wide range of RF communication systems, including, but not limited to, base stations, mobile devices (for instance, smartphones or handsets), laptop computers, tablets, Internet of Things (IoT) devices, and/or wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electrical overstress (EOS) protection device comprising:
   an anode terminal and a cathode terminal;
   a first silicon controlled rectifier (SCR) comprising a first PNP bipolar transistor and a first NPN bipolar transistor that are cross-coupled with a base of the first PNP bipolar transistor connected to a collector of the first NPN bipolar transistor and with a base of the first NPN bipolar transistor is connected to a collector of the first PNP bipolar transistor, wherein an emitter of the first NPN bipolar transistor is connected to the cathode terminal;
   a second NPN bipolar transistor including a base connected to the anode terminal and an emitter connected to an emitter of the first PNP bipolar transistor; and
   a second PNP bipolar transistor including an emitter connected to an emitter of the second NPN bipolar transistor and a base connected to the base of the first PNP bipolar transistor,
   wherein two or more paths for current conduction are present during a positive overstress transient that increases a voltage of the anode terminal relative to the cathode terminal, including a first path through the first SCR and a second path through the second NPN bipolar transistor and the second PNP bipolar transistor.

2. The EOS protection device of claim 1, further comprising a third PNP bipolar transistor having an emitter connected to a collector of the second PNP bipolar transistor, and a collector connected to the cathode terminal.

3. The EOS protection device of claim 1, wherein the two or more paths for current conduction are further configured to increase a holding current and a holding voltage of the first SCR.

4. The EOS protection device of claim 1, further comprising a plurality of cascaded NPN bipolar transistors providing a third path for current conduction during a negative overstress transient that increases a voltage of the cathode terminal relative to the anode terminal.

5. The EOS protection device of claim 4, further comprising a plurality of deep N-well (DNW) isolated diodes each having a cathode connected to a collector of a corresponding one of the plurality of cascaded NPN bipolar transistors.

6. The EOS protection device of claim 4, further comprising a second SCR including a first cascaded NPN bipolar transistor of the plurality of cascaded NPN bipolar transistors and a third PNP bipolar transistor, wherein a base of the third PNP bipolar transistor is connected to a collector of the first cascaded NPN bipolar transistor and a base of the first cascaded NPN bipolar transistor is connected to a collector of the third PNP bipolar transistor and to the cathode terminal.

7. The EOS protection device of claim 6, wherein an emitter of the third PNP bipolar transistor is connected to a collector of the second PNP bipolar transistor.

8. The EOS protection device of claim 1, further comprising a diode connected between the collector of the second PNP bipolar transistor and a collector of the second NPN bipolar transistor.

9. The EOS protection device of claim 1, wherein the first SCR is formed of one or more p-type active (P+) regions and one or more n-type active (N+) regions, and wherein one of the P+ regions is isolated from one of the N+ regions via a poly gate.

10. The EOS protection device of claim 1, wherein the first SCR comprises an electrically floating n-well forming the base of the first PNP bipolar transistor and the collector of the first NPN bipolar transistor so as to reduce a capacitance of the EOS protection device.

11. The EOS protection device of claim 1, wherein the anode terminal has a total capacitance corresponding to a series combination of a diffusion capacitance of a base-to-emitter junction of the second NPN bipolar transistor and a depletion capacitance of the first SCR.

12. The EOS protection device of claim 11, wherein the total capacitance is substantially linear over an operational voltage range of the anode terminal.

13. An electrical overstress (EOS) protection device comprising:
a p-type substrate;
a plurality of wells including a first p-type well (PW), a second PW, an n-type well (NW), a first deep n-type well (DNW) electrically isolating the first PW from the p-type substrate, and a second DNW electrically isolating the second PW from the p-type substrate;
a plurality of active regions including a first n-type active (N+) region formed in the first PW and connected to a cathode terminal, a second N+ region formed in the second PW, a first p-type active (P+) region formed in the NW and connected to the second N+ region in metallization, and a second P+ region formed in the second PW and connected to an anode terminal,
wherein the first P+ region, the NW, and first PW form a first PNP bipolar transistor, and the first N+ region, the first PW, and the NW form a first NPN bipolar transistor that is cross-coupled with the first PNP bipolar transistor to form a first silicon controlled rectifier (SCR), wherein the second N+ region, the second PW, and the second DNW form a second NPN bipolar transistor, and wherein the first P+ region, the NW, and the p-type substrate form a second PNP bipolar transistor, wherein two or more paths for current conduction are present during a positive overstress transient that increases a voltage of the anode terminal relative to the cathode terminal, including a first path through the first SCR and a second path through the second NPN bipolar transistor and the second PNP bipolar transistor.

14. The EOS protection device of claim 13, wherein the anode terminal has a total capacitance corresponding to a series combination of a diffusion capacitance of a base-to-emitter junction of the second NPN bipolar transistor and a depletion capacitance of the first SCR.

15. The EOS protection device of claim 14, wherein the total capacitance is substantially linear over an operational voltage range of the anode terminal.

16. The protection device of claim 15, wherein each of the plurality of DNW isolated diodes is connected to a corresponding cascaded NPN bipolar transistor, the third path for current conduction operating during a negative overstress transient that increases a voltage of the cathode terminal relative to the anode terminal.

17. A protection device, comprising:
an anode terminal and a cathode terminal;
a first silicon controlled rectifier;
an NPN bipolar transistor and a PNP bipolar transistor, the NPN bipolar transistor and the PNP bipolar transistor are configured to provide a second silicon controlled rectifier in parallel to the first silicon controlled rectifier, wherein two or more paths for current conduction are present during a positive overstress transient that increases a voltage of the anode terminal relative to the cathode terminal, including a first path through the first silicon controlled rectifier and a second path through the PNP bipolar transistor; and
a plurality of deep N-well (DNW) isolated diodes coupled to a third path of the two or more paths.

18. The protection device of claim 17, wherein the device is manufactured using deep submicron technology.

19. The protection device of claim 17, wherein each of the first silicon controller rectifier, the PNP bipolar transistor, and the NPN bipolar transistor is formed of one or more p-type active (P+) regions and one or more n-type active (N+) regions, and wherein one of the P+ regions is isolated from one of the N+ regions via a poly gate.

20. The protection device of claim 17, wherein a total capacitance at the anode terminal is substantially linear over an operational voltage range of the anode terminal.

* * * * *